United States Patent
Lu et al.

[11] Patent Number: 6,107,134
[45] Date of Patent: Aug. 22, 2000

[54] HIGH PERFORMANCE DRAM STRUCTURE EMPLOYING MULTIPLE THICKNESS GATE OXIDE

[75] Inventors: Nicky C. Lu, Palo Alto, Calif.; Kun-Zen Chang, Hsinchu, Taiwan

[73] Assignee: Etron Technology, Inc., Hsin-Chu, Taiwan

[21] Appl. No.: 09/431,134

[22] Filed: Nov. 1, 1999

Related U.S. Application Data

[62] Division of application No. 09/084,409, May 26, 1998.

[51] Int. Cl.⁷ .............................................. H01L 21/8242
[52] U.S. Cl. ........................................... 438/239; 438/253
[58] Field of Search ..................... 438/239, 238, 438/252, 253, 300, 301; 365/189.11, 230.06, 51, 52, 63, 226

[56] References Cited

U.S. PATENT DOCUMENTS

| | | | |
|---|---|---|---|
| 4,525,811 | 7/1985 | Masuoka | 365/154 |
| 5,057,449 | 10/1991 | Lowrey et al. | 437/52 |
| 5,083,172 | 1/1992 | Kiyono | 357/23.6 |
| 5,251,172 | 10/1993 | Yamauchi | 365/189.09 |
| 5,293,336 | 3/1994 | Ishii et al. | 365/149 |
| 5,327,002 | 7/1994 | Motoyoshi | 257/380 |
| 5,426,065 | 6/1995 | Chan et al. | 437/52 |
| 5,497,021 | 3/1996 | Tada | 257/369 |
| 5,502,009 | 3/1996 | Lin | 437/239 |
| 5,576,226 | 11/1996 | Hwang | 437/24 |
| 5,595,922 | 1/1997 | Tigelaar et al. | 437/40 |
| 5,672,521 | 9/1997 | Barsan et al. | 437/24 |
| 5,703,392 | 12/1997 | Guo | 257/392 |
| 5,994,181 | 11/1999 | Hsieh et al. | 438/239 |

OTHER PUBLICATIONS

Ishiuchi et al. "Embedded DRAM Technologies", IEDM Technical Digest, 1997, p33–36.

*Primary Examiner*—David Nelms
*Assistant Examiner*—David Lam
*Attorney, Agent, or Firm*—George O. Saile; Stephen B. Ackerman; Billy J. Knowles

[57] ABSTRACT

A DRAM device having improved performance of peripheral circuitry is described. The performance is improved by selectively having MOS transistors with a thinner gate oxide in peripheral circuits having a lower voltage applied to their gate electrodes. The DRAM device will maintain reliability by having MOS transistors with a thicker gate oxide in the memory cells and selected peripheral circuitry that are subjected to a higher voltage at their gate electrodes. Further this invention describes methods of fabricating the DRAM device with selectively placed multiple gate oxide thickness.

17 Claims, 6 Drawing Sheets

HIGH PERFORMANCE DRAM STRUCTURE EMPLOYING MULTIPLE THICKNESS GATE OXIDE

This is a division of patent application Ser. No. 09/084,409, filing date May 26, 1998, A High Performance Dram Structure Employing Multiple Thickness Gate Oxide, assigned to the same assignee as the present invention.

BACKGROUND OF THE INVENTION

1. Field of the Invention

This invention relates to dynamic random access memory (DRAM) and more particularly to DRAM circuits and fabrication processes that will enhance performance.

2. Description of Related Art

All circuits in a DRAM chip, such as the memory cell, sense amplifier, row and column decoders, and input/output buffers, are presently designed and fabricated using the same gate oxide thickness. This design and fabrication approach has nearly satisfied all applications in personal computers. The speed and performance of DRAM have not been a determining factor for performance of personal computers at clocking speed less than 133 MHz. As the deep sub-micrometer process (0.18 μm–0.13 μm feature size) is becoming more prevalent for fabricating integrated circuits such as DRAM, the operating voltage needs to be reduced. The reduction in operating voltage will degrade the speed of the DRAM circuits. At this same time, the clocking frequency is increasing beyond 133 MHz and the access time and cycle time of the DRAM chip within a personal computer memory is having a larger impact on performance.

Historically, the thickness of the gate oxide used in the fabrication of the metal oxide semiconductor (MOS) transistors has been adjusted to insure the reliability of the pass transistor within the memory cell. To insure proper operation, the word line voltage is boosted by a voltage at least one threshold voltage $V_T$ greater than the supply voltage of the memory cell array. This voltage will cause a higher voltage field within the gate oxide of the pass transistor, thus requiring the increased thickness. This increased thickness of the gate oxide is presently used throughout all the MOS transistors of all the circuits of the DRAM chip. The peripheral circuits external to the memory cell array will have an operational voltage less than the voltage created for the word line and thus will have degraded performance because of the thicker gate oxide. This degraded performance of the peripheral circuits will limit the improvement of the access and cycle time necessary to meet the performance requirements of the future personal computer applications.

The concept of an integrated circuit chip having multiple thickness of gate oxide used in the fabrication of MOS transistors within an integrated circuit is discussed in "Embedded DRAM Technologies," H. Ishiuchi et al., page 33, IEDM Technical Digest, 1997. Ishiuchi et al. describes the use of an embedded DRAM circuit incorporated with an array of logic circuits. The embedded DRAM will have MOS transistors with a thicker gate oxide while the separate logic circuits will have MOS transistors with a thinner gate oxide. The performance of the embedded DRAM will have the same performance issues as described above, since the peripheral circuits of the embedded DRAM will have the thicker gate oxide.

U.S. Pat. No. 5,057,449 (Lowery et al.), U.S. Pat. No. 5,293,336 (Ishii et al.), U.S. Pat. No. 5,576,226 (Hwang et al.), U.S. Pat. No. 5,083,172 (Kiyono), and U.S. Pat. No. 4,525,811 (Masuoka) each discloses DRAM devices and methods of fabrication where a thin gate oxide is used in the fabrication of the MOS transistors of the peripheral circuitry of a DRAM, while a thick gate oxide is used in the fabrication of the MOS pass transistor within the memory cells of the DRAM. The use of the thin gate oxide in the fabrication of the MOS transistors in the peripheral circuitry will improve performance of the DRAM device, but the MOS transistors within the boost voltage circuit, the word line driver, and the data input/output drivers have voltages that are larger than the power supply voltage source. This will increase the electrical field present within the gate oxide of the MOS transistors and increase the reliability problem. The reliability problem is the increase of the probability of failure of the gate oxide due to the stress of the electrical field degrading the gate oxide. This will reduce the overall reliability of the DRAM chip.

U.S. Pat. Nos. 5,426,065 (Chan et al.), 5,327,002 (Motoyoshi), and U.S. Pat. No. 5,703,392 (Guo) each describes Static Random Access Memory (SRAM) that has different gate oxide thickness used within each memory cell to modify the MOS threshold voltages as necessary to improve operation.

U.S. Pat. No. 5,251,172 (Yamauchi) describes a DRAM wherein the sense amplifier voltage is adjusted by having different power supply voltage sources $V_{cc}$ and different substrate biasing voltage sources $-V_{bb}$ connected to the transistors of the sense amplifier. Adjusting the threshold voltage $V_T$ of each of the MOS transistors within the sense amplifier will decrease the delay present before sense amplification begins.

U.S. Pat. No. 5,595,922 (Tigelaar et al.), U.S. Pat. No. 5,502,009 (Lin), U.S. Pat. No. 5,672,521 (Barsan et al.), and U.S. Pat. No. 5,497,021 (Tada) each discloses methods for forming gate oxides of MOS transistors of different thickness upon a semiconductor substrate.

SUMMARY OF THE INVENTION

An object of this invention is to provide a DRAM device having improved performance of peripheral circuitry by having MOS transistors with a thinner gate oxide in circuits having a lower voltage.

Another object of this invention is to provide a DRAM device having improved reliability by having the memory cells and selected peripheral sub-circuitry subjected to a higher voltage having thicker gate oxide.

To accomplish these and other objects a DRAM has an array of memory cells. Each memory cell is comprised of a pass transistor and a cell capacitor. The pass transistor will have a thicker gate oxide thickness of 50 to 80 Angstroms (preferably 70 Angstroms) to improve the reliability of each memory cell.

Connected to the array of memory cells is a set of latching sense amplifiers. Each sense amplifier is comprised of MOS transistors with thinner gate oxides. The thickness is of the thinner gate oxide is from 30 to 50 Angstroms (preferably 45 Angstroms). Further, to enhance the performance of the latching sense amplifiers, a semiconductor bulk region of the well containing each of the MOS transistors is connected to a reference voltage of ground. Whereas, the semiconductor bulk region of the well containing the memory cell array is connected to a more negative biasing voltage. The MOS transistors of the latching sense amplifier with the semiconductor bulk region connected to the grounding voltage ($V_{ss}$) allows an improvement in the amount of time required to sense the charge present in the selected DRAM memory cell.

The pass transistor of the memory cell with the semiconductor bulk connected to a negative bias voltage reduces the leakage current through the channel of the pass transistor that discharges the cell capacitor.

An address bus is connected to row and column address buffers receive and buffer address segments of an input address bus. The address buffers are comprised of MOS transistors with thinner gate oxide. Connected to the row address buffer is a word line decoder. The word line decoder decodes the row address segment to select a row of the array of memory cells. The word line decoder is comprised of MOS transistors with thinner gate oxides. Connected to the word line decoder are the word line drivers that provide the current and voltage level necessary to activate a selected row of the array of memory cells. The word line drivers are composed of MOS transistors having the thicker gate oxide.

Connected to each of the sense amplifiers is an input/output driver. The input/output drivers transfer data between the sense amplifiers and external circuitry. Depending upon the voltage requirements of the external circuitry the input/output drivers are optionally comprised of MOS transistors with thicker gate oxides.

Timing and control circuits provide timing and control signals to control operation of the DRAM. The timing and control circuits are comprised of MOS transistors with thinner gate oxides.

The pass transistors of the memory cell require a higher voltage at the gate to activate the pass transistor to write or read data from the cell capacitor. A boost voltage circuit is connected to the plurality of word line drivers to create the boosted voltage necessary to activate the pass transistors of a selected row of the memory array. The boost voltage circuit is comprised MOS transistors with thicker gate oxides.

A method of fabricating a DRAM having dual gate oxide thickness upon a semiconductor substrate begins by forming a gate oxide having a first thickness upon the semiconductor substrate. A photoresist is coated upon the semiconductor substrate to protect a first region of the substrate with a mask. This will leave an exposed area. The gate oxide is then removed from the exposed area.

A gate oxide of a second thickness is then formed upon the exposed area of the semiconductor substrate.

The first thickness or the second thickness of gate oxide can alternately be either the thicker or thinner gate oxide described above. The gate oxide is formed of silicon oxide, silicon nitride, or silicon oxynitride at a temperature of between about 750° C. and 1000° C.

An alternative to the method will have the first thickness of the gate oxide as the thinner gate oxide. The first thickness is not removed from the exposed area. The second thickness of the gate oxide is formed and is added to the first thickness to construct the thicker gate oxide.

DETAILED DESCRIPTION OF THE INVENTION

Figure 1:
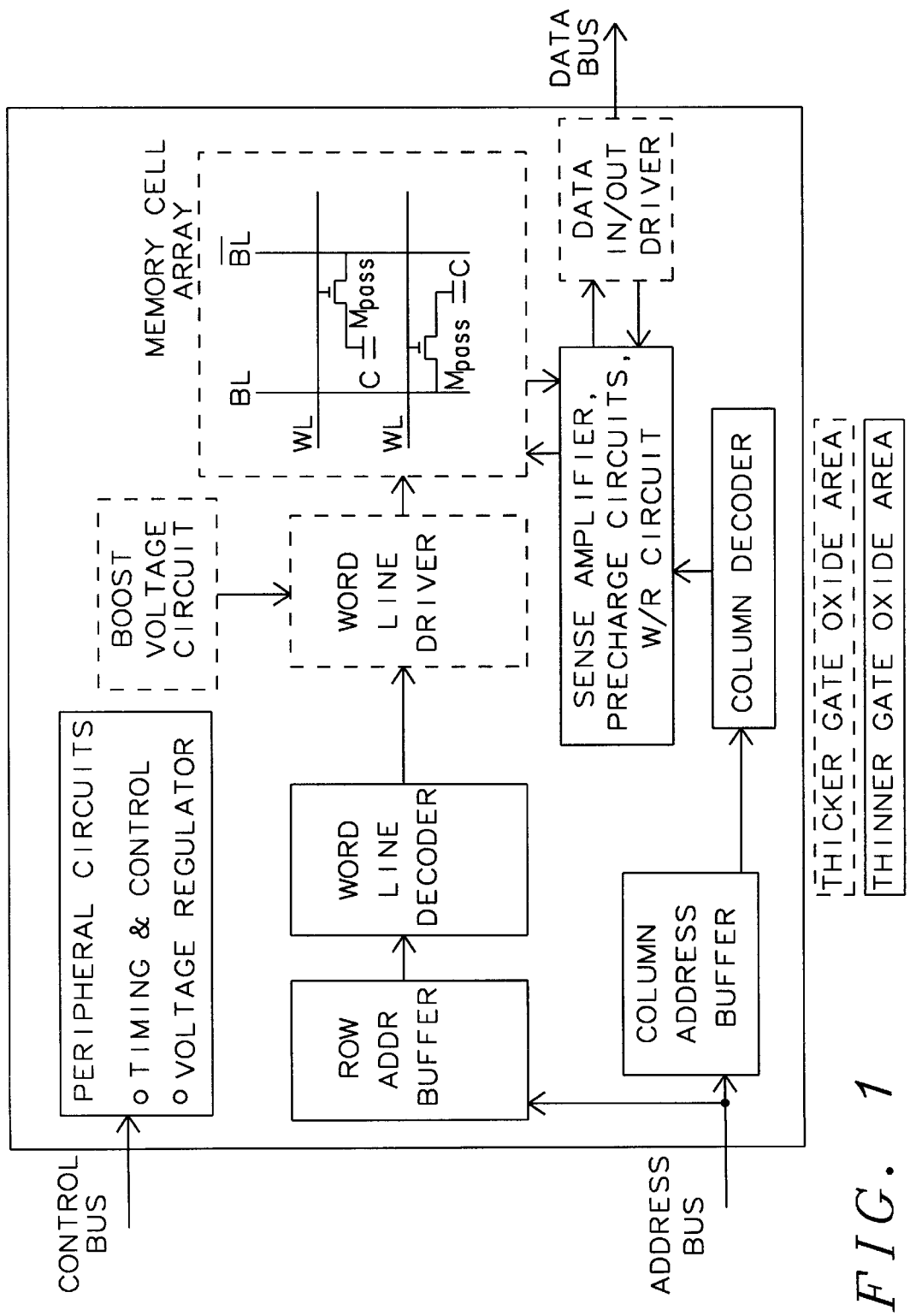
FIG. 1 is a diagram showing schematically the physical structure of a DRAM of this invention.

Refer now to FIG. 1 for a description of the structure of the DRAM of this invention. An input address bus is connected to the row address buffer and the column address buffer to receive and buffer the address of the location of the digital data to be stored or fetched from the DRAM. The row address buffer is connected to the word line decoder to decode a first portion of the input address bus received by the row address buffer to select a row of the memory cell array. The word line buffer is connected to the word line driver to provide an appropriate level of voltage and current to drive the selected row of the memory cell array.

A column decoder is connected to the column address buffer to decode a second portion of the address bus received by the column address buffer to select a column of the memory cell array. The column decoder is connected to the sense amplifier. The sense amplifier is connected to the memory cell array to sense the level of charge present within a selected cell of the memory cell array for a fetch or read of the digital data stored in the selected cell. To write data to the selected memory cell, data is transferred from the input/output driver circuit to the write circuit and the sense amplifier. The write circuit and the sense amplifier will transfer the data to the selected cell.

The word line driver will place a boost voltage on a selected row of the memory cell array that is greater than the supply voltage by at least one threshold voltage level $V_T$ of the pass transistor and generally a factor of from 1.5 to two time greater than the supply voltage. The boost voltage circuit is connected to the word line driver and will generate the boost voltage required to drive the selected row of the memory cells of the memory cell array.

The peripheral circuits are connected to the control bus. The control bus will provide appropriate timing and control signals to the DRAM. The peripheral circuits will decode the control bus and distribute timing and control signals within the DRAM.

Those portions of the DRAM that will have a higher voltage present at the gate electrodes of the MOS transistors require a thicker gate oxide to prevent breakdown of the gate oxide and insure a suitable level of reliability. The portions requiring the thicker gate oxide will be the boost voltage circuit, the memory cell array, and the word line driver. Dependent on the external circuitry connected to the data bus, the input/output circuitry will optionally require the thicker gate oxide. The thicker gate oxide will have a thickness of from 50 Angstroms to 80 Angstroms, preferably 70 Angstroms.

Those portions of the DRAM that will have a lower voltage present at the gate electrodes of the MOS transistors, do not require a thicker gate oxide to prevent breakdown of the gate oxide and insure an suitable level of reliability and therefore, can take advantage of a thinner gate oxide to enhance performance. The portions of the DRAM that can take advantage of the thinner gate oxide will be the row and column address buffers, the word line and column decoders, the sense amplifier, and the peripheral circuits. The thinner gate oxide will have a thickness of from 30 Angstroms to 60 Angstroms, preferably 45 Angstroms.

Figure 2:
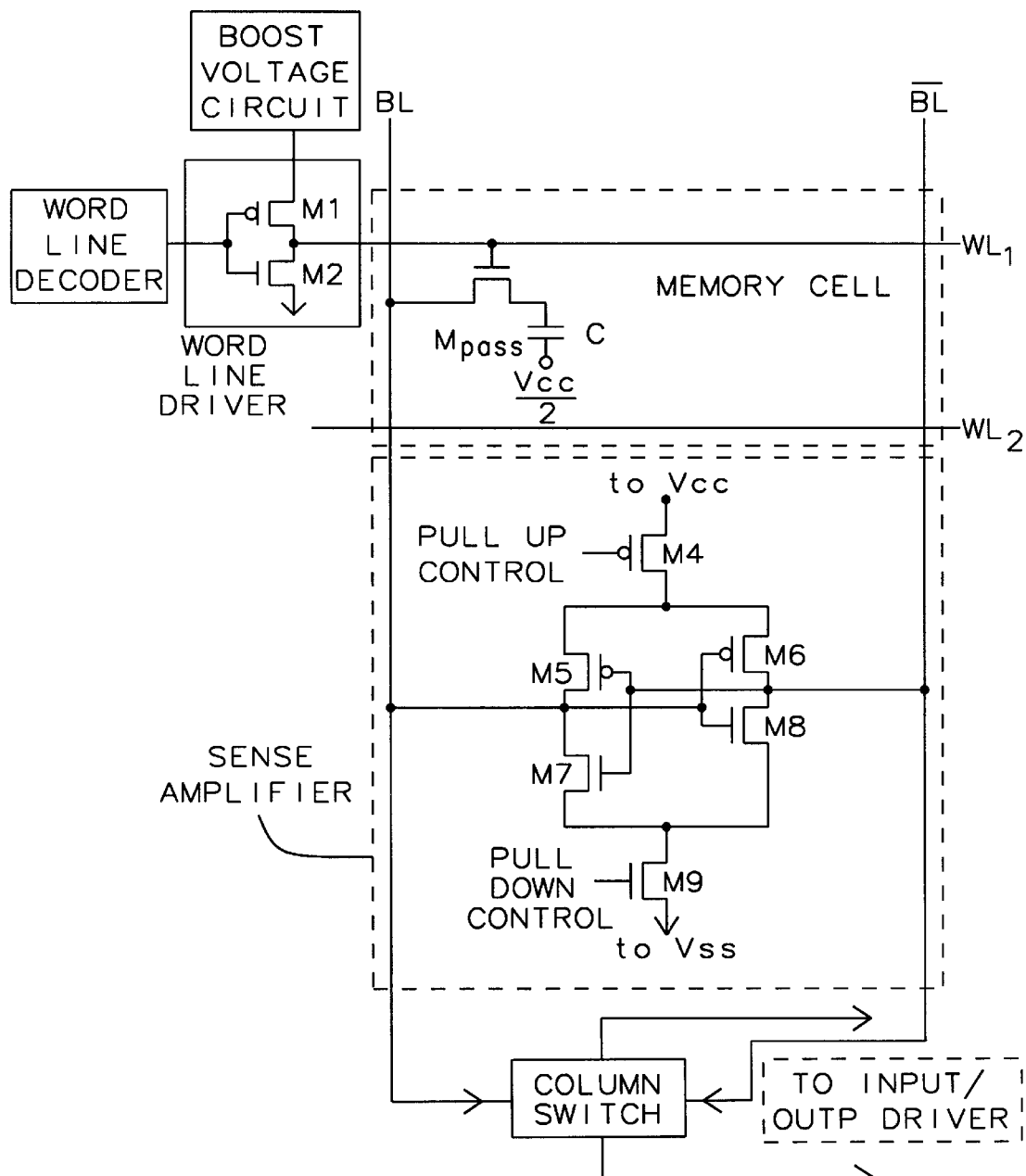
FIG. 2 is a partial schematic diagram of the DRAM of this invention showing in particular the sense amplifier of this invention.

Refer now to FIG. 2 for a more detailed schematic of portions of the DRAM of this invention. The word line decoder is attached as described above to the word line driver. The word line driver is composed of the MOS transistors $M_1$ and $M_2$. The source of the MOS transistor $M_1$ is connected to the boost control voltage circuit. The boost voltage as described above is a voltage that is at least one threshold voltage $V_T$ of the pass transistor $M_{pass}$ greater than the power supply voltage source $V_{cc}$. If the signal at the gate electrode of the MOS transistor $M_1$ is a logical 0, the voltage at the gate electrode of the MOS transistor $M_1$ approaches that of the ground reference point GND. The voltage across the gate oxide of the MOS transistors $M_1$ will then be at approximately the boost voltage. Likewise, if the word line WL is charged to the boost voltage and the signal at the gate of the MOS transistor $M_2$ is the logical 0, the voltage at the gate electrode of the MOS transistor $M_2$ approaches that of the ground reference point GND. The voltage across the gate oxide of the MOS transistors $M_2$ is then also at approximately the boost voltage.

The gate oxide for the MOS transistors $M_1$ and $M_2$ and for those in the boost voltage circuit are thicker than the gate oxide in the word line decoder to insure a high reliability.

The memory cell is composed of the cell pass transistor $M_{pass}$ and the cell capacitor C. The drain of the cell pass transistor $M_{pass}$ is connected to the first plate of the cell capacitor C and a second plate of the cell capacitor C is connected to a fixed voltage, which is generally placed at one half of the supply voltage ($\frac{1}{2} V_{cc}$).

The source of the cell pass transistor $M_{pass}$ is attached to the bit line BL. The gate of the cell pass transistor $M_{pass}$ is connected to the word line $WL_1$. To store or write a logical 0 to the cell capacitor C, the word line $WL_1$ is brought to the boost voltage level to activate the cell pass transistor $M_{pass}$. The bit line BL will brought to a voltage approaching that of the ground reference voltage GND and any change present at the cell capacitor C will be removed. At this time, the gate oxide of the cell pass transistor $M_{pass}$ will have a voltage of approximately that of the boost voltage added to the negative voltage bias $-V_{bb}$ present across it. The gate oxide of the cell pass transistor $M_{pass}$ will have the thicker gate oxide to insure there is no life time reliability problem of the gate oxide of the cell pass transistor $M_{pass}$.

Whereas, to store a logical 1 to the cell capacitor C, the bit line $BL_1$ will be brought to a voltage approaching the supply voltage $V_{cc}$. The word line WL will be brought to the voltage level of the boost voltage to activate the cell pass transistor $M_{pass}$. The voltage present on the bit line $BL_1$ will charge the cell capacitor to a voltage level approaching that of the power supply voltage source $V_{cc}$. The boost voltage must be at least one threshold voltage level $V_T$ of the cell pass transistor $M_{pass}$, preferably a factor of two times the supply voltage $V_{cc}$ of the cell pass transistor $M_{pass}$. The boost voltage insures the activation of the cell pass transistor $M_{pass}$ when the bit line BL and the cell capacitor C are brought to the voltage level of the supply voltage $V_{cc}$. The voltage across the gate oxide of the cell pass transistor $M_{pass}$ is that of the boost voltage added to the substrate biasing voltage source $-V_{bb}$. The thick gate oxide in this region of the DRAM insures the reliability of the gate oxide of the pass transistor $M_{pass}$.

The sense amplifier is composed of the MOS transistors $M_4$, $M_5$, $M_6$, $M_7$, $M_8$, and $M_9$ are configured as a latching sense amplifier, a structure that is well known in the art. During a read or fetch operation the bit lines BL and $\overline{BL}$ will be brought to a voltage that is approximately one half the voltage level of the power supply voltage level $V_{cc}/2$. The pull-up control and the pull-down control will be activated by the column decoder and the timing and control section of the peripheral circuits to activate the sense amplifier. The cell pass transistor $M_{pass}$ will be activated and the level of charge present on the cell capacitor C will be amplified to form the digital data on the bit line BL. The MOS transistors $M_4$, $M_5$, $M_6$, $M_7$, $M_8$, and $M_9$ always have a voltage level across their gate oxides that is no greater than the voltage level of the power supply voltage source $V_{cc}$. The gate oxide of the MOS transistors $M_4$, $M_5$, $M_6$, $M_7$, $M_8$, and $M_9$ is then fabricated as a thin gate oxide.

The bit lines BL and $\overline{BL}$ are connected to the column switch. The column switch will transfer the digital data from the bit lines BL and $\overline{BL}$ during a read or fetch operation to the input/output driver. The MOS transistors of the column switch, which will be activated by the column decoder and the timing and control section of the peripheral circuit, will have improved performance with the thin gate oxide.

The input/output driver is connected to external circuitry that may have higher operating voltages than the DRAM, and may therefore, optionally require a thicker gate oxide in its MOS transistors.

Figure 3:
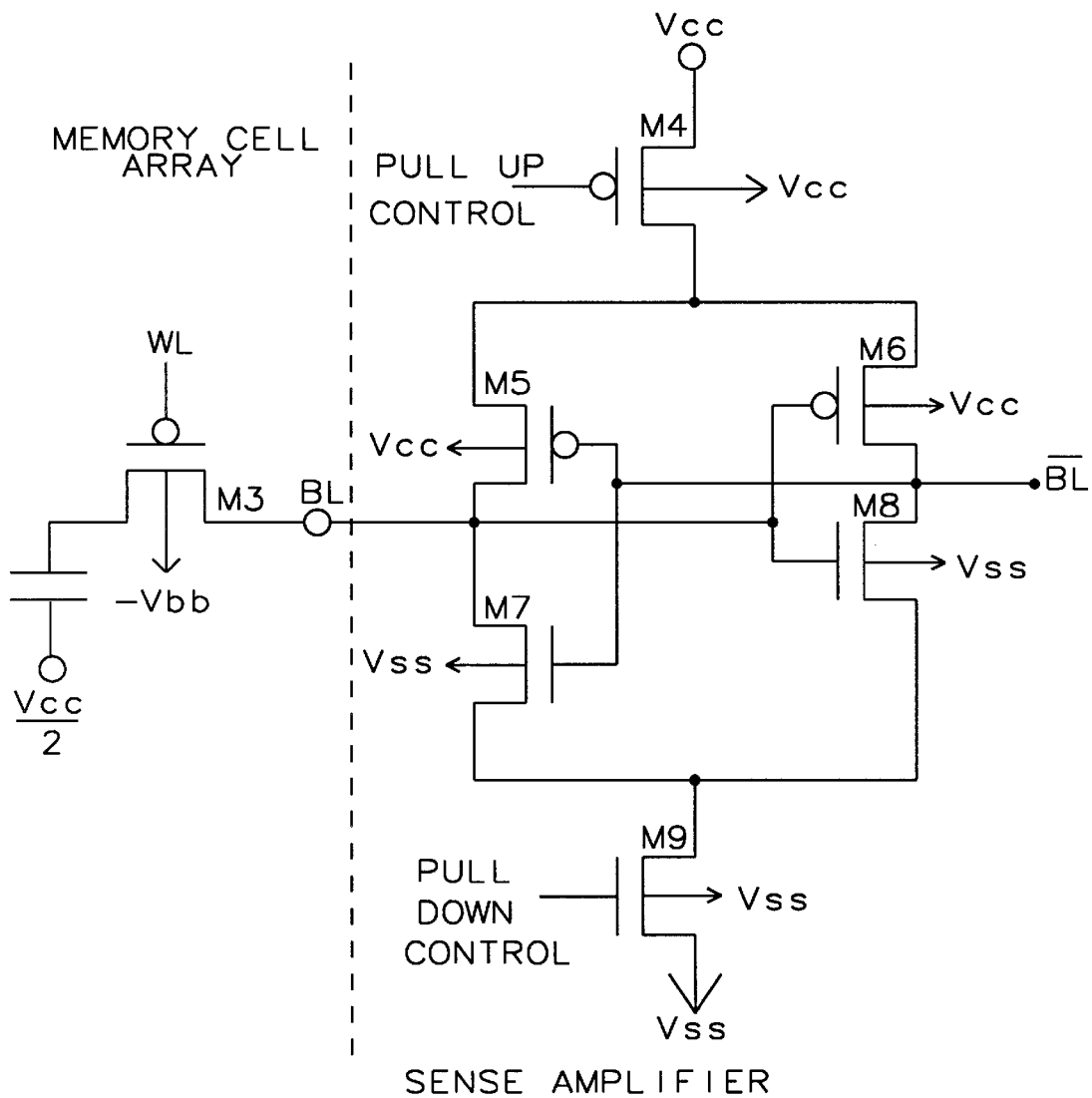
FIG. 3 is a schematic diagram of the sense amplifier circuit of this invention.

The sense amplifier is further shown in FIG. 3. The MOS transistors $M_4$, $M_5$, $M_6$, $M_7$, $M_8$, and $M_9$ are, as described in FIG. 2, configured as a latching sense amplifier. The bulk semiconductor of the well containing the MOS transistors $M_4$, $M_5$, and $M_6$ will be set to a voltage level of the power supply voltage source $V_{cc}$. The bulk semiconductor of the well containing the MOS transistors $M_7$, $M_8$, and $M_9$ will be connected to the ground reference potential. This is opposed to the conventional structure of current advanced DRAM design where the bulk semiconductor of the well containing MOS transistors $M_7$, $M_8$, and $M_9$ would be connected to a substrate biasing voltage source $-V_{bb}$ that has a voltage level of approximately $-1.0$ V ($-0.5$ V to $-1.5$ V).

The DRAM cell as shown would continue to have the bulk semiconductor of the well containing the memory cell array would be connected to the substrate biasing voltage source $-V_{bb}$, which has the voltage level of approximately $-1.0$ V ($-0.5$ V to $-1.5$ V).

By connecting the bulk semiconductor of the well containing the MOS transistors $M_7$, $M_8$, and $M_9$ to the ground reference voltage GND, the threshold voltage of the MOS transistors $M_7$, $M_8$, and $M_9$ will be approximately 0.4 V. This will allow the time at which the charge on the cell capacitor to be sensed by the sense amplifier to improve by at least approximately 20%. Whereas, having the bulk semiconductor of the well containing the cell pass transistor $M_{pass}$ biased to the substrate biasing voltage source $-V_{bb}$ connected to the MOS transistors $M_7$, $M_9$, and $M_9$, forces the threshold voltage $V_T$ of the MOS transistors $M_7$, $M_8$, and $M_9$ to a voltage level of approximately 0.7 V. This will insure a level of noise immunity appropriate to guarantee the integrity of the digital data, but this comes at the sacrifice of the cell performance.

Refer now to FIGS. 4a–4f for a discussion of the methods of fabrication of the dual gate oxide thickness on the surface of a semiconductor substrate 10. The DRAM is fabricated using deep sub-micrometer process. N-type substrate 10 is used. A P-well 20 and N-well 30 is formed on the n-type substrate 10 using ion implantation and thermal drive-in diffusion process. The shallow trench isolation (STI) technology is used to form an isolation area 40 between active area 50 and 60. The p-field implant area 70 the under isolation area 40 in P-well 20 is used to enhanced its isolation between devices. The n-field implant area 80 under the isolation area 40 in N-well is used to enhance its isolation between devices. The resistivity of N-type substrate 10 is from 2 to 10 Ohm-cm. The depth of STI in the isolation area 40 is from 0.4 μm to 1.2 μm. The depth of N-well 30 and P-well 20 are 0.8 μm to 5.0 μm.

Figure 4A:
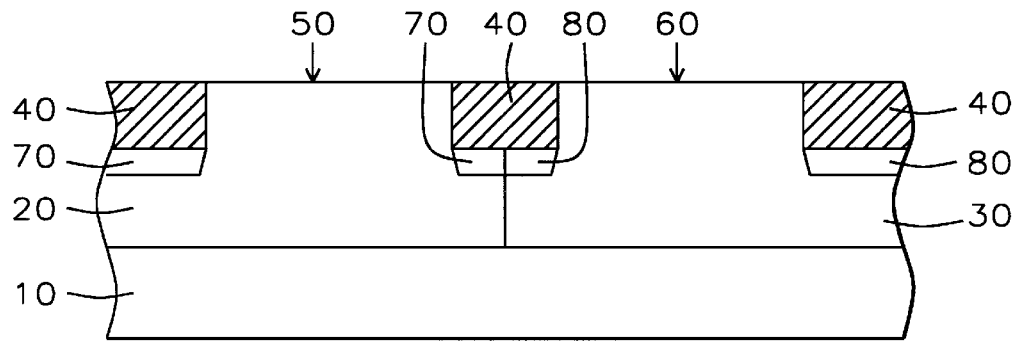
FIGS. 4a–4f are cross-sectional views of a semiconductor substrate illustrating the method of forming gate oxide having multiple thickness of this invention.
Figure 4B:
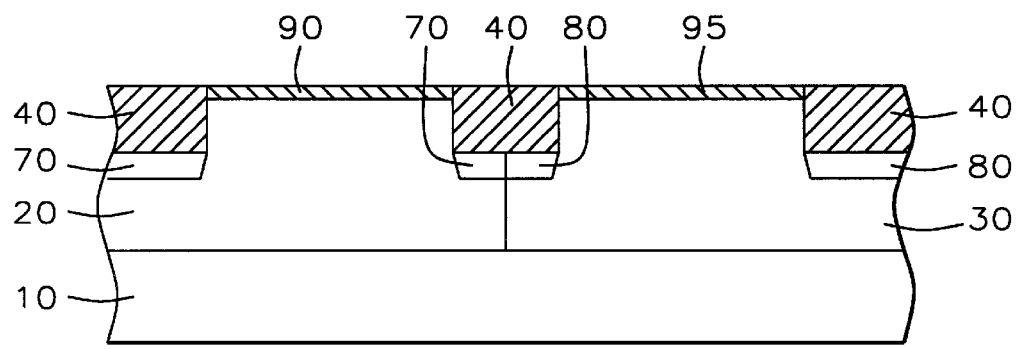
Figure 4C:
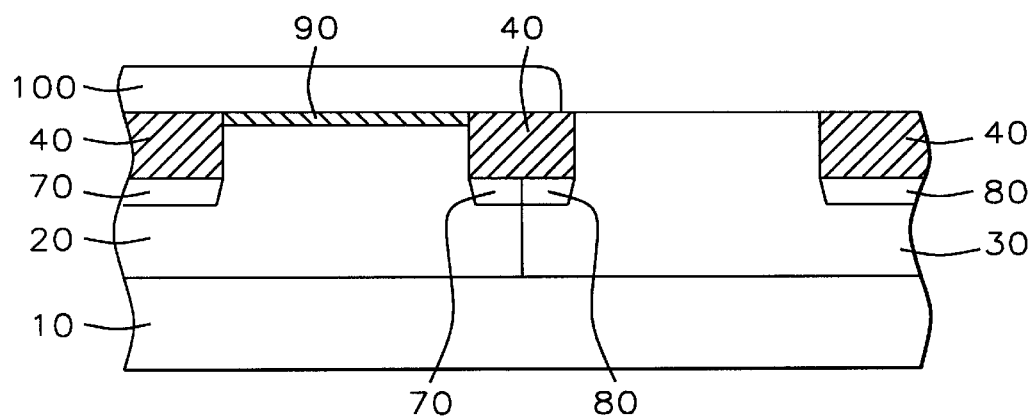
Figure 4D:
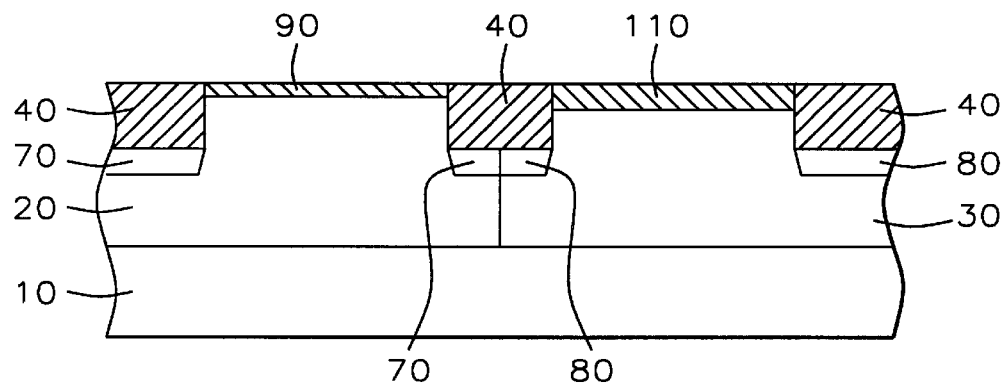
Figure 4E:
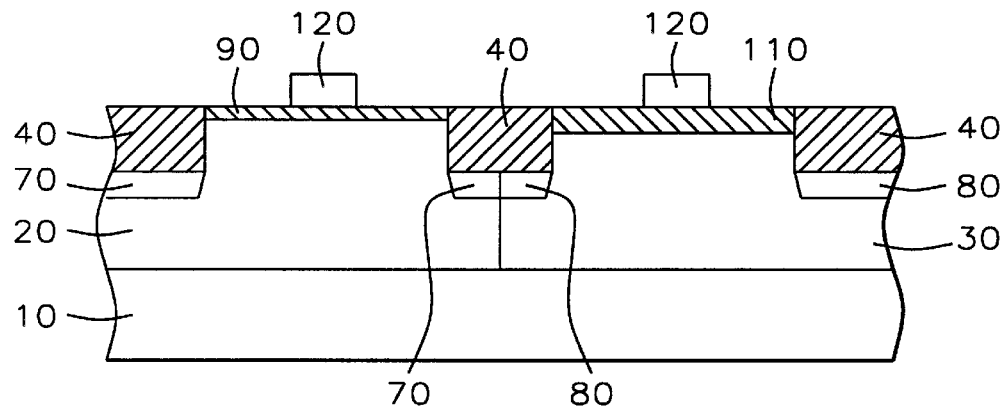

After the formation of active area, the gate oxide 90 and 95 is grown as shown in FIG. 4b. Then, photoresist 100 covered the thicker gate oxide area by the photolithographic process and the gate oxide 95 is removed by etch process as shown in FIG. 4c. After the photoresist 100 is stripped, the gate oxide 110 is grown, as shown in FIG. 4d. The gate oxide 110 is of a different thickness than that of gate oxide 90. The thickness of thinner gate oxide is from 30 to 60 Angstroms (preferably 45 Angstroms) and is grown temperature is from 750 to 1000° C. The thickness of thicker gate oxide is from 50 to 80 Angstroms (preferably 70 Angstroms) and is grown temperature is from 750° C. to 1000° C. After the dual gate oxide 90 and 110 is grown, the polysilicon gate layer is deposited and gate 120 is formed for both NMOS and PMOS by the photolithographic process, as shown in FIG. 4e. The thickness of polysilicon gate 120 is from 0.1 to 0.4 μm and its deposition temperature is from 550° C. to 750° C.

Figure 4F:
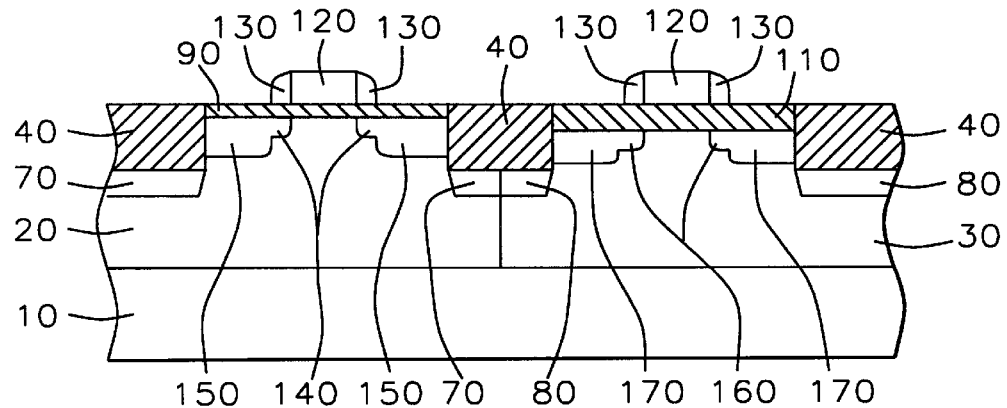

Refer now to FIG. 4f. After the polysilicon gate 120 formation on different thickness gate oxides 90 and 110, the lightly doped areas 140 and 160 is formed using ion implantation process for NMOS region 140 and for PMOS region 160. Then, the spacer 130 is formed by an etch back process. The heavily doped source and drain area for NMOS region 150 and PMOS region 170 are formed using ion implantation and annealing process. The material of spacer 130 is Chemical Vapor Deposited (CVD) oxide or nitride. The lightly doped implantation 140 for the NMOS has an implant dose of from $3 \times 10^{12}$ cm to $8 \times 10^{13}$ cm$^2$ of an implant species such as Arsenic with implant energy is from 40 to 80 Kev. The lightly doped implantation 160 for the PMOS has an implant dose that is from $3 \times 10^{12}$ cm$^2$ to $8 \times 10^{13}$ cm$^2$ with an implant species such as Boron Fluoride (BF$_2$) with implant energy of 30 to 70 Kev. The heavily doped implantation 150 for the source and drain of NMOS has implant dose is from $1 \times 10^{19}$ cm$^2$ to $1 \times 10^{16}$ cm$^2$ of an implant species such as Arsenic with an implant energy is 40 to 80 Kev. The lightly dose implantation 170 for the PMOS has implant dose is from $1 \times 10^{15}$ cm$^2$ to $1 \times 10^{16}$ cm$^2$, of an implant species is Boron Fluoride (BF$_2$) and implant energy is 30 to 70 Kev. The annealing temperature for the source and drain area is from 750° C. to 1000° C. and annealing time is from 1 to 60 minutes.

The method, as shown, may have the thicker oxide as the gate oxide 90 and the thinner oxide as the gate oxide 110. Alternatively, the thicker oxide maybe the gate oxide 110 and the thinner gate oxide 90. Further, the gate oxide 95 may not necessarily be removed after the masking 100. In fact, the gate oxide 110 could be formed by additional oxidation of the exposed area of the semiconductor substrate to grow the gate oxide 95 to form the gate oxide 110. In this case, the gate oxide 90 would of necessity be the thinner oxide.

While the method described above shows the NMOS and PMOS transistors having different gate oxide thickness, the functional areas within the DRAM such as the row and column address buffers, the word line and column decoders, the sense amplifier, the pre-charge circuits for the bit lines, the write/read circuits, and the other peripheral circuits that perform voltage regulation, timing and control will have the thinner gate oxide. The boost voltage circuit, the word line drivers, the pass transistors of the memory cells in the cell array, and optionally the data input/output drivers will have the thicker gate oxide.

The thinner gate oxide will provide approximately a 20% improvement in performance parameters such as delay over the equivalent circuits fabricated using the thicker gate oxide. Placing the thicker gate oxide selectively in areas of the DRAM having higher voltages present on the MOS transistors will insure that the MOS transistors meet their reliability requirements.

Figure 5:
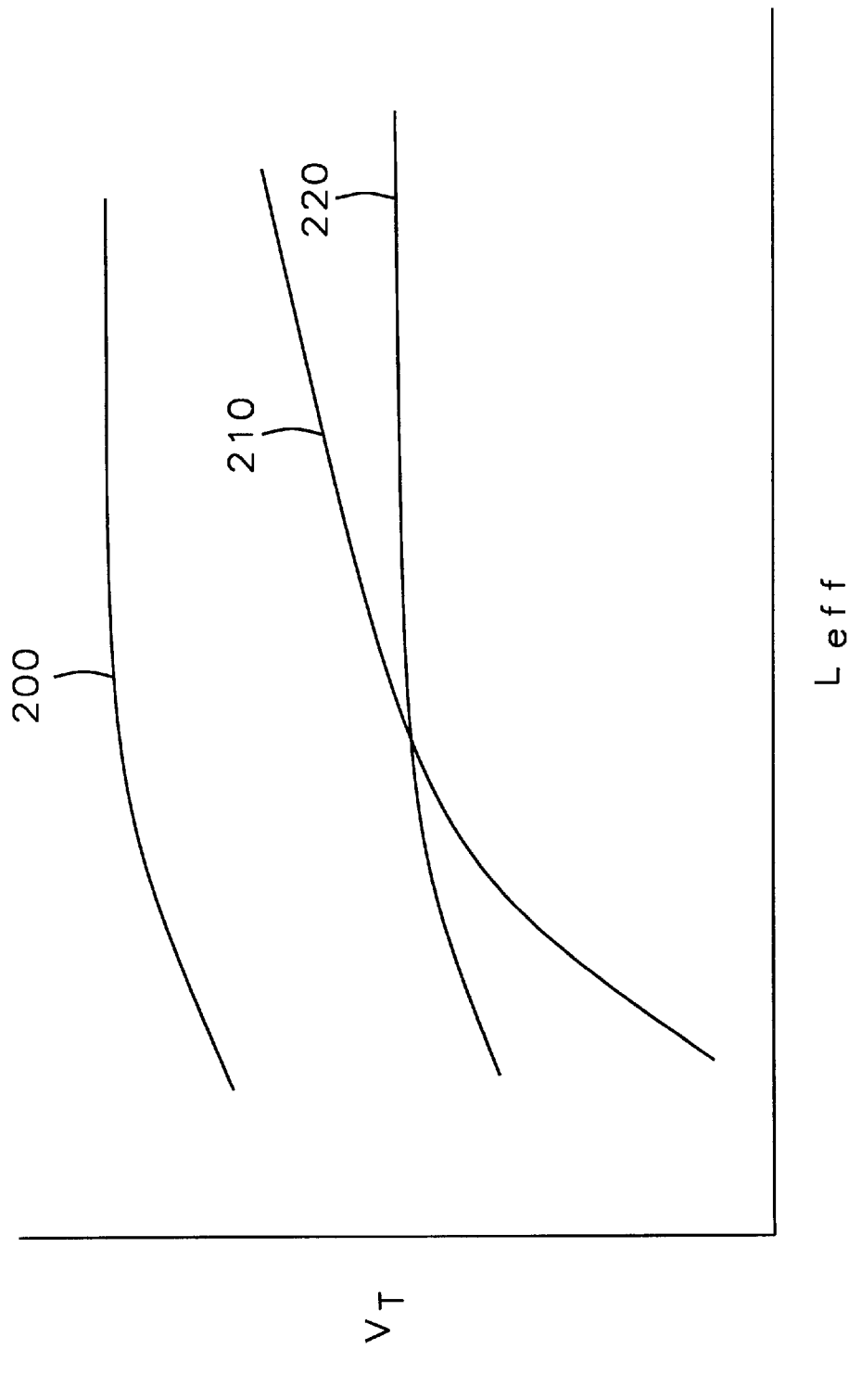
FIG. 5 is a graph plotting the function of the gate-to-source threshold voltage $V_T$ versus the $L_{eff}$ of MOS transistors of this invention compared with the MOS transistors of the prior art.

The threshold voltage $V_T$ of the MOS transistors $M_7$, and $M_8$ of FIG. 3 must be insensitive to changes in the effective gate length $L_{eff}$ to have the sense amplifier perform correctly. Refer now to FIG. 5 to appreciate the advantages of this invention when compared to the prior art in assuring matching of the threshold voltage $V_T$ of the MOS transistors $M_7$, and $M_8$ of FIG. 3, while improving switching speed. The plot of FIG. 5 shows the change in the gate-to-source threshold voltage $V_T$ versus the effective length $L_{eff}$ of the gate of the MOS transistors of the sense amplifier. The plot 200 is for MOS transistors of the prior art having a thick gate oxide and the semiconductor bulk connected to the substrate biasing voltage $-V_{bb}$. The plot 210 is for MOS transistors of the prior art having a thick gate oxide and having the semiconductor bulk connected to the ground reference potential GND. The plot 220 is for MOS transistors of this invention having a thin gate oxide and the semiconductor bulk connected to the ground reference potential GND.

The plot 200 shows that the MOS transistors of the prior art having a thick gate oxide and the semiconductor bulk connected to the substrate biasing voltage $-V_{bb}$ are less sensitive to the variations in the gate length $L_{eff}$. However, the gate-to-source threshold voltage $V_T$ is relatively high indicating that the switching speed of the MOS transistors is relatively slow.

The plot 210 shows that the MOS transistors of the prior art having a thick gate oxide and the semiconductor bulk connected to the ground reference voltage GND are more sensitive to the variations in the gate length $L_{eff}$. The sensitivity of the gate-to-source threshold voltage $V_T$ to changes in the effective gate length $L_{eff}$ causes variations and mismatches in the switching speed of the MOS transistors within the circuit on the DRAM array.

The plot 220 shows that the MOS transistors of this invention having a thin gate oxide and the semiconductor bulk connected to the ground reference voltage GND are less sensitive to the variations in the gate length $L_{eff}$. The gate-to-source threshold voltage $V_T$ are lower indicating that the switching speed of these MOS transistors is relatively faster.

While this invention has been particularly shown and described with reference to the preferred embodiments thereof, it will be understood by those skilled in the art that various changes in form and details may be made without departing from the spirit and scope of the invention.

The invention claimed is:

1. A method of fabricating a Dynamic Random Access Memory (DRAM) upon a semiconductor substrate, comprising the steps of;

forming a gate oxide having a first thickness upon the semiconductor substrate;

protecting a first region on the substrate with a mask, leaving an exposed area, wherein said first region is to include an array of DRAM cells, a plurality of word line drivers, a boost voltage circuit, and an input/output circuit;

removing the gate oxide having a first thickness from the exposed area; and forming a gate oxide having a second thickness, that is less than said first thickness, upon the exposed area of the semiconductor substrate, wherein the exposed area is to include a plurality of sense amplifiers, a row address buffer, a word line decoder, a column address buffer a column address decoder, and a timing and control circuit.

2. The method of claim 1 wherein the gate oxide having a first thickness is formed to a thickness or between about 50 and 80 Angstroms.

3. The method of claim 1 wherein the gate oxide having a second thickness is formed to a thickness of between about 30 and 60 Angstroms.

4. The method of claim 1 wherein each of the gate oxides is formed of a material selected from the consisting of silicon oxide, silicon nitride, and silicon oxynitride.

5. The method of claim 1 wherein each of the gate oxides is formed at a temperature of between about 750° C. and 1000° C.

6. A method of fabricating a DRAM upon a semiconductor substrate, comprising the steps of;

forming a gate oxide having a first thickness upon the semiconductor substrate;

protecting a first region on the substrate with a mask, leaving an exposed area, wherein said first region is to include a plurality of sense amplifiers, a row address buffer, a word line decoder, a column address buffer, a column address decoder, and a timing and control circuit;

removing the gate oxide having a first thickness from the exposed area;

forming a gate oxide having a second thickness, that is greater than said first thickness, upon the exposed area of the semiconductor substrate, wherein the exposed area is to include an array of DRAM cells, a plurality of word line drivers, a boost voltage circuit, and an input/output circuit.

7. The method of claim 6 wherein the gate oxide having a first thickness is formed to a thickness of between about 30 and 60 Angstroms.

8. The method of claim 6 wherein the gate oxide having a second thickness formed to a final thickness of between about 50 and 80 Angstroms.

9. The method of claim 6 wherein each of the gate oxides is formed of a material selected from the consisting of silicon oxide, silicon nitride, and silicon oxynitride.

10. The method of claim 6 wherein each of the gate oxides is formed at a temperature of between about 750° C. and 1000° C.

11. A method of fabricating a DRAM upon a semiconductor substrate comprising:

forming a gate oxide with a first thickness upon the semiconductor substrate masking a first set of areas on the substrate, whereby said first set of areas is comprised of a plurality of sense amplifiers, a row address buffer, a word line decoder, a column address buffer, a column address decoder, and a timing and control circuit; and forming a gate oxide with a second thickness by forming at lease one layer of gate oxide with a first thickness upon the semiconductor substrate in a second set of areas, whereby said second set of areas is comprised of an array of DRAM cells, a plurality of word line drivers, a boost voltage circuit, and an input/output circuit.

12. The method of claim 11 wherein the gate oxide with a first thickness has a thickness of from approximately 30 Angstroms to approximately 60 Angstroms.

13. The method of claim 11 wherein the gate oxide with a second thickness has a thickness of from approximately 50 Angstroms to approximately 80 Angstroms.

14. The method of claim 11 wherein the gateoxide with a second thickness is selected from the group of gate oxides consisting of silicon dioxide, silicon nitride, and silicon oxynitride.

15. The method of claim 11 wherein the gate oxide with a first thickness is selected from the group of gate oxides consisting of silicon dioxide, silicon nitride, and silicon oxynitride.

16. The method of claim 11 wherein the gate oxide with a first thickness is formed at a temperature of from approximately 750° C. to approximately 1000° C.

17. The method of claim 11 wherein the gate oxide with a second thickness is formed at a temperature of from approximately 750° C. to approximately 1000° C.

* * * * *